United States Patent [19]
Wiscombe et al.

[11] Patent Number: 5,014,002
[45] Date of Patent: May 7, 1991

[54] ATE JUMPER PROGRAMMABLE INTERFACE BOARD

[75] Inventors: Paul C. Wiscombe, Fremont; Arie Shavit, Cupertino, both of Calif.

[73] Assignee: VLSI Technology, Inc., San Jose, Calif.

[21] Appl. No.: 340,109

[22] Filed: Apr. 18, 1989

[51] Int. Cl.$^5$ .............................. G01R 1/02; G01R 1/04
[52] U.S. Cl. .............................. 324/158 F; 324/158 P; 439/510
[58] Field of Search ........... 324/158 P, 158 F, 73 PC; 439/507–512

[56] References Cited

U.S. PATENT DOCUMENTS

| 3,584,300 | 6/1971 | Schulz et al. | 324/158 F |
|---|---|---|---|
| 3,702,423 | 11/1972 | Kern | 324/158 F |
| 3,808,532 | 4/1974 | Yuska | 324/158 F |
| 3,963,986 | 6/1976 | Morton et al. | 324/158 F |
| 4,283,100 | 8/1981 | Griffin et al. | 439/510 |
| 4,417,204 | 11/1983 | Dehmel et al. | 324/158 F |
| 4,443,756 | 4/1984 | Lightbody et al. | 324/158 F |
| 4,498,716 | 2/1985 | Ward et al. | 324/158 F |
| 4,516,817 | 5/1985 | Deters | 439/510 |
| 4,574,235 | 3/1986 | Kelly et al. | 324/158 P |
| 4,816,754 | 3/1989 | Buechele et al. | 324/158 F |
| 4,835,469 | 5/1989 | Jones et al. | 324/158 P |
| 4,883,430 | 11/1989 | Siemon et al. | 439/510 |

FOREIGN PATENT DOCUMENTS

| 2104669 | 3/1983 | United Kingdom | 324/158 F |
| 2157507 | 10/1985 | United Kingdom | 324/158 F |

OTHER PUBLICATIONS

"Programmable connector", by Korosec et al. by IBM Tech. Disc. Bull., vol. 15, #3, 8/72, pp. 865–866; 324–158F.

Primary Examiner—Reinhard J. Eisenzopf
Assistant Examiner—William J. Burns
Attorney, Agent, or Firm—Flehr, Hohbach, Test Albritton & Herbert

[57] ABSTRACT

Relays and toggle switches for programming the electrical interconnections between automated test equipment and the pins of a DUT are replaced with manually programmable jumpers connected between various jumper terminals mounted on a jumper programmable interface board. The jumper terminals are located on the interface board in close proximity to the pins of a DUT to minimize interference and crosstalk. Pulldown and pullup resistors as well as bypass capacitors are optionally incorporated into the jumpers. The jumper terminals provide easy access to pin electronics (PE) test signals and to various power and ground plane in a multilayer interface board so that the test conditions for each pin can be manually programmed by selection of jumper connections.

9 Claims, 6 Drawing Sheets

ATE JUMPER PROGRAMMABLE INTERFACE BOARD

BACKGROUND OF THE INVENTION

1. Field of the Invention

This invention relates to automated test equipment for testing integrated circuits, and, more particularly, to programmable interface boards used between the automated test equipment (ATE) and an integrated circuit device under test (DUT).

2. Prior Art

Testing of integrated circuits has become much more difficult for a number of reasons. One reason is that the integrated circuits now being produced and tested are much faster and more complex than previous integrated circuits. This means that the signals for testing these integrated circuits operate at higher frequencies and consequently require short, impedance-controlled signal lines to minimize signal delay, mistiming and distortion. Another reason is that many more application specific integrated circuits (ASICs) are now being produced, each one of which has different electrical requirements and configurations for the various pins or leadless terminals. Because ASICs usually are produced in low production volume and because of the large variety of ASIC products now being offered, traditional methods for testing high volume integrated circuits using dedicated test setups are not particularly applicable to testing a large variety of low volume ASICs.

Previously, a conventional interface board has been used to interconnect the ATE equipment and the DUT. The DUT was fixed in a holder mounted on a DUT printed circuit board. The DUT board was then mounted to and electrically connected to the interface board. To accommodate various electrical test signal requirements for a particular DUT, electrical connections between the interface board and the individual pins of the socket are sometimes made with wires which are wirewrapped onto the socket pins. Additional electrical components, such as bypass capacitors and pull-up resistors, are connected and disconnected between various pins of the socket by hand soldering, and unsoldering, as required. For production runs, even though they may be relatively low-volume production runs, this technique is time consuming and sometimes unreliable. Because there are designed to be used in a production environment, industrial grade DUT boards are relatively expensive and consequently the connections are often reworked to accommodate various different ASIC products. As a consequence of being reworked several times, these expensive boards often become unreliable and must be discarded.

A conventional interface board is typically an 18-inch diameter, relatively large, circular-shaped, multi-layer printed circuit board which has a smaller 6-inch diameter DUT board mounted in its center. The interface board serves as an interface between the ATE signals and, perhaps, several hundred or more terminals or pins of a DUT. An interface board has several hundred or more signal lines which radiate from the DUT board in the center of the interface board to the periphery of the interface board. An interface board usually is a multi-layer printed circuit board with various signal traces and power and ground planes.

One commonly used interface board is a Switch Programmable Interface Board which uses a combination of relays and toggle switches to connect the terminal pins of a DUT mounted on a DUT board to the various ATE test signals and power supplies. Each of the DUT pins is connected to one relay and to one 3-way toggle switch. Operation of the relays is controlled by the software of an ATE test program. The toggle switches for each pin are manually set as required to provide power, ground, or no-contact. The very large number of relays and toggle switches (one set for each of the several hundred or more DUT pins) are positioned on the periphery of the interface board. Because each relay is electronically controlled by the ATE test program software, each relay requires a control line. As the number of pins on DUTs has increased, the number and complexity of signal lines and relay control lines on conventional interface boards has also increased. Performance at higher frequencies has also been affected due to the increased number of lines and due to inductance and capacitive pickup problems associated with long signal leads. The increased number of pins also increases problems associated with those interconnections between the interface board and the pins of the DUT socket which require reusable wirewrap and solder connections.

FIG. 1A shows a circuit diagram for configuring the connections of a Switch Programmable Performance Board. The pin electronics PE circuit of an ATE test system is connected to a DUT terminal or pin. The DUT terminal is also connected to one contact terminal of a relay. The other contact terminal of the relay is connected to one terminal of a resistor R with its other terminal connected to a DPS2 terminal. The other contact terminal of the relay is connected to the output terminal of a three-way toggle switch. The toggle switch selectably connects power supplies VDD, VSS, or no-contact (NC) to the relay contact.

FIG. 1B shows an alternative circuit diagram for configuring a pin of a Switch Programmable Interface Board. A DUT terminal is directly connected to the output terminal of a three-way toggle switch. Power, ground and no-contact (NC) are selectably connected to the DUT terminal. A relay is closed to connect a PE circuit to the DUT terminal.

U.S. Pat. No. 4,354,268 discloses an "intelligent" head which uses relay contacts to connect the pin electronics board of a computer-controlled automated test system to a DUT. The relay contacts selectively connect either the pin electronics or special test functions from the test head to the DUT.

With the increased DUT pincounts and higher test frequencies being used, using relays and toggle switches increases programming complexity and requires large amounts of area on the interface board to mount those components, one relay and toggle switch for each signal line. The relays and toggle switches are mounted on the outer edge of an interface board and the DUT is mounted in the center of the interface board. Because of the large number of relays and toggle switches and because they are located on the periphery of the interface board, it is necessary to have long interconnecting conductors with increased inductance and interference pickup. Consequently, it is desirable to minimize or to altogether eliminate relays and toggle switches for testing an integrated circuit having a very large number of terminal pins.

SUMMARY OF THE INVENTION

It is therefore an object of the invention to provide a simple system for programming the interconnections between the pin electronics circuits of an automated test system and the pins of a DUT without the need for electronic relays and switches.

It is another object of the invention to provide a programmable interconnection system which occupies reduced circuit board area.

It is another object of the invention to provide an automated test system environment in which signal transmission lines have improved signal transmission characteristics.

It is another object of the invention to provide an automated test system interconnection system which reduces switching noise on power and ground leads by using shorter conductors with less inductance and by locating decoupling capacitors closer to terminals or pins of a device being tested.

In accordance with these and other objects of the invention, a jumper programmable interface board is provided which allows for manual programming of the electrical interconnections between automated test equipment and the various terminals or pins of a DUT. An interface board according to the invention includes means for selectably making connections between various conductive paths on the interface board. These conductive paths are, in turn, connected, for example, to the PE circuits, the DUT pins or terminals, or power sources and ground planes in a multilayer printed circuit board. The means for selectably connecting includes a number of jumper terminals and means for manually connecting between these jumper terminals. The manual connection means includes jumpers with the jumper terminals located on the interface board in close proximity to a DUT pin. The jumper terminals associated for a particular pin of a DUT are grouped accommodate jumpers have uniformly spaced terminals. The jumper terminals include jumper pins which are fixed to the interface board and which extend out of the surface of the board. The jumpers for connecting between the jumper pins alternatively include passive devices such as resistors for use as pull-up or pull-down resistors and capacitors for use a bypass capacitors.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On modifications and equivalents, which may be included within the spirit and scope of the invention as defined by the appended claims.

Figure 1A:
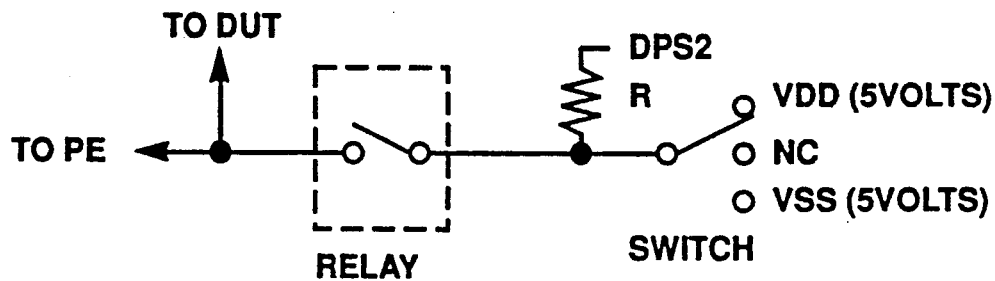
FIGS. 1A and 1B are alternative circuit diagrams of prior art systems for interconnecting pin electronics circuits and power/ground to a DUT using a relay and a 3-position toggle/switch.
Figure 1B:
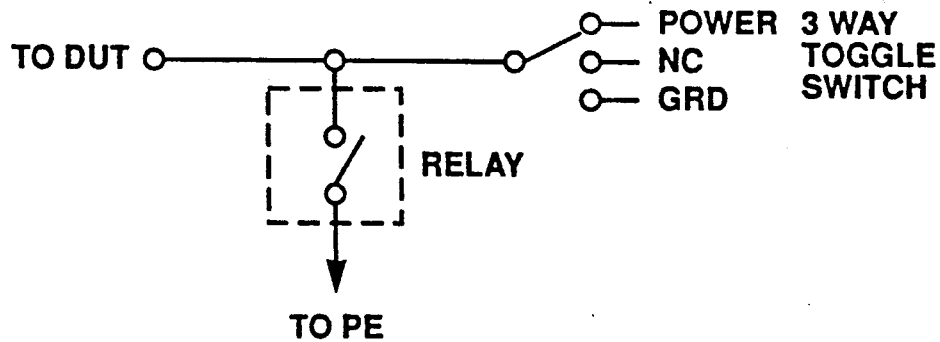
Figure 2:
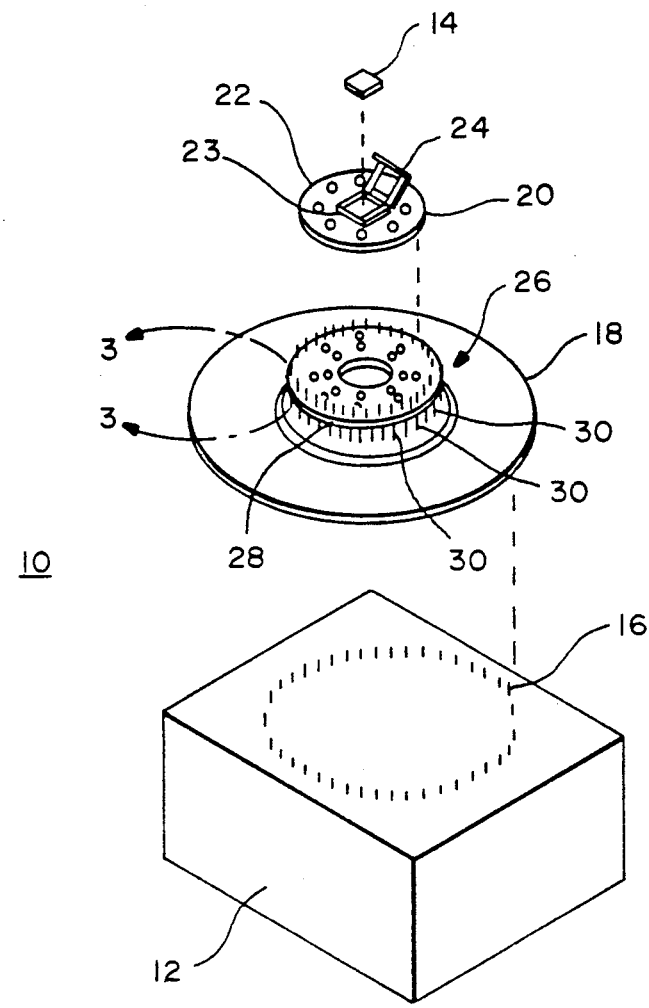
FIG. 2 is an exploded, perspective view of a jumper programmable interface board and a DUT board showing their relationship to an automated tester system.

FIG. 2 shows an overview of an automated test equipment (ATE) system 10 such as manufactured by a number of vendors. Such an ATE system 10 includes a test head subsystem 12, which includes electronic circuits which are controlled by the software of a host control computer. These electronic circuits, called pin electronics (PE) circuits generate the necessary test signals and control signals for each particular type of integrated circuit device under test (DUT) 14. To test the performance of a particular DUT 14, various test signals as well as power supply voltages and ground potentials are made available on a number of pin electronics (PE) pins (typically shown as 16), which are located on the top surface of the test head 12 and arranged in a circular pattern as indicated in the drawing. To test a DUT 14, which has, for example, 256 or more terminals or pins, 256 or more PE pins 16 are provided on the test head 12.

To provide for connections between the DUT 14 and the various test signals, power supply voltages, and grounds, an interface board 18 is typically provided between the PE pins 16 and the DUT 14. The PE pins 16 engage with corresponding apertures or sockets on the interface board 18. Note that the interface board must provide, for example, signal lines, or traces, for 256 or more signals or power connections. To facilitate uniform testing of a large number of DUT pins, interface boards 18 are often circular multilayer printed circuits boards with several power and ground planes as is known in the art. Signal traces start at the periphery of the circular interface board 18 and converge toward the center of the interface circuit board 18, where the DUT 14 is mounted.

According to the teachings of the present invention, a specially designed interface board 18 is provided which simplifies the process of setting up the various interconnections between the test head and the device being tested because no software control of relays or setting of tested because no software control of relays or setting of toggle switches is required. In addition, this new interface board eliminates use of bulky relays and switches. By directly routing signals to a DUT 14, signal lines on the interface board are shortened and signal transmission and interference characteristics are improved.

As described hereinbelow, these improvements are accomplished by manually programming the connections between the PE pins and the DUT pins. Each pin or terminal of a DUT (depending upon whether the DUT has leads or pins extending therefrom or depending upon whether the DUT is leadless and has contact terminals) has associated with it a group of jumper terminals which are manually connected to appropriate PE pins with manual jumpers.

The DUT 14 can be directly mounted to the interface with a number of integrated packages styles and pin-counts, a circular printed-circuit DUT board 20 is provided. A holder 22 holds the DUT on the DUT board 18 and makes connections between the DUT board and the pins or terminals of a DUT, as required. The holder 22 includes a base 23 which is mounted to the DUT board and which contains electrical contacts for connections between the DUT and the DUT board. A hinged cover member 24 releasably holds the DUT in the base 23.

An interface connector member 26 is provided as an intermediate interface element between the DUT board 20 and the interface board 18. The interface connector member 26 includes a disk-shaped base 28 to which the DUT board is mechanically mounted using appropriate screws and threaded sockets. Connections between the DUT board 20 and the interface board 18 are made using a number of connection pins 30, typically designated by reference numerals, which are mounted in the interface connector member 26. The connection pins 30 are mounted in the base 28 to extend upwardly and downwardly so that their respective ends engage suitable connection sockets in the DUT board and the interface board. The connections provided interface board (without relays or switches) are kept short and can be laid out to have well-controlled impedance and crosstalk characteristics.

Figure 3:
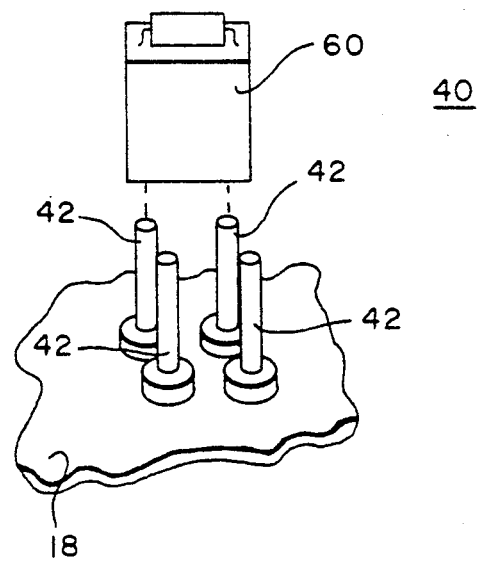
FIG. 3 is an enlarged, perspective view, taken generally within the area designated F3 of FIG. 2, of a portion of the interface board showing jumper pins in relation to a jumper according to the invention.

FIG. 3 shows an enlarged perspective view of a group 40 of terminal pins 42. This view is representative of a number of groups of terminal pins. The terminals pins 42 are grouped together with adjacent pins spaced apart by a uniform distance, for example, one tenth of an inch. Pairs of terminals 42 can be connected with jumper conductors to interconnect various conductors on an interface board 18. The terminal pins 42 are mounted on the interface board 18 near the connection pins 30 in order to provide jumper terminals in close proximity to a DUT pin.

Figure 4:
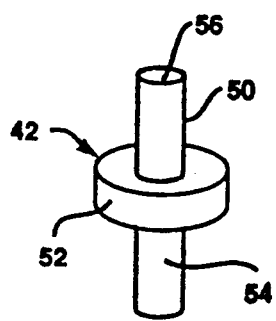
FIG. 4 is a perspective view of a representative jumper terminal pin.

FIG. 4 shows a preferred embodiment of a jumper pin 42, which includes a central conductor 50 axially mounted in and extending outwardly from a cylindrical base 52, which is formed of a molded plastic material. These pins are similar in design to standard wire-wrap terminal pins and the conductor 50 optionally has a square crosssection. Adjacent pins are spaced apart a predetermined distance d, for example, one-tenth of an inch. One end 54 of a terminal pin 42 is adapted to be soldered into position in a hole formed through a conductor on an interface board. The other end 56 of a jumper pin is adapted to be engaged with a jumper described in connection with FIG. 5A. A terminal pin 42 thus functions as jumper terminal to connect a jumper conductor with various ones of the PE, power, or ground conductors formed on the interface board or to a conductor connected to a DUT terminal or pin. Any suitable terminals can be used to connect a jumper to a conductor and the invention is not limited merely to the particular terminal pins 42 or jumpers disclosed. For example, eyelets and other types of pins or posts can be used.

Figure 5A:
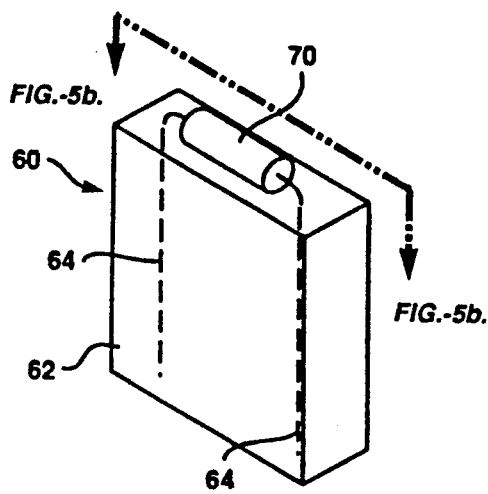
FIG. 5A is a perspective view of one embodiment of a jumper including a passive component.
Figure 5B:
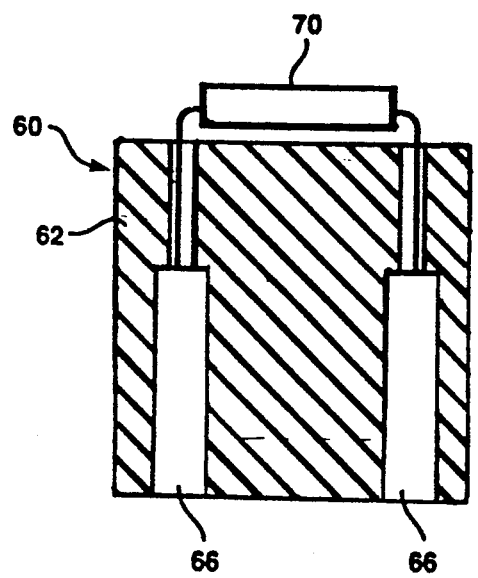
FIG. 5B is a sectional view of the jumper of FIG. 5A.

FIGS. 5A and 5B show a preferred embodiment of a jumper 60 for connecting two terminal pins 42 together. The jumper includes a molded, rectangular body 62. The body is formed of, for example, a molded plastic material and has a conductor 64 (diagrammatically shown in FIG. 5A) molded into the body 64 as shown. FIG. 5B shows that the conductor 64 includes end portions which are shaped as sockets 66 for engagement with the ends 56 of jumper pins 42. The sockets are spaced apart by one-tenth of an inch to match the spacing between mounted terminal pins 42. This spacing facilitates jumping between two adjacent pins 42. Alternatively, any suitable jumper can be used, such as solid jumper bridges, wires, or coaxial cables. The jumpers described herein are illustrative of one particular type of jumper device.

FIGS. 5A and 5B also show that a jumper may include an electrical component 70, such as a capacitor or a resistor connected in series with the conductor 64 of the jumper. If no electrical component is used, the two conductors 64 are shorted together by a conductor.

Figure 6:
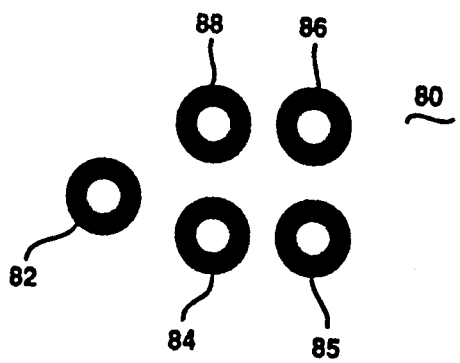
FIG. 6 shows a representative physical layout pattern for jumper terminals on a jumper programmable interface board according to the invention.

FIG. 6 shows a typical, representative physical layout pattern 80 for jumper terminals, formed, for example, from printed-circuit conductive pads 82, 84, 85, 86, 88 on an interface board 18. Adjacent pads are spaced apart one-tenth of an inch to accommodate a jumper 60. Apertures are formed in the center of the surface of each pad to accept the end 54 of a jumper pin 42. Pad 82 is connected to a power supply voltage obtained from a power plane of a multilayer interface printed circuit board 18. Pads 84,85 are connected together and to a ground plane in the interface board. Pad 86 is connected to the PE conductor. Pad 88 is connected to one of the terminals or pins of a DUT.

A jumper-programmable interface board in accordance with the invention is used to provide electrical contact system such as signal from PE circuit cards, device power, and ground. An interface board using the invention is preferably a multilayer printed circuit board with power and ground planes to allow surface access to power and ground. Stripline traces are formed on the surface and/or microstrip traces are formed on internal layers to provide for connection of ATE test channels to DUT pins or terminals.

FIGS. 7 through 11 show representative electrical connections for a jumper-programmable interface according to the invention. Each signal line or power trace is broken for a short interval with connection points, or jumper terminals, at each side of the break. Jumper connections are made between holes formed in the interface board using jumper wires. Alternatively, jumper pins 42 are inserted in the holes and jumper structures 60 connect pairs of pins. The section of the trace which connects to the DUT pin has a series of connection points located near the gap. Adjacent to these are connection points of the interface board power and ground planes. The number of connection points required varies with the number of device power supplies used.

FIGS. 7 through 11 show examples of how DUT pins are programmed by manual connection of jumpers to obtain specific test functions by use of solid jumpers 60 or jumpers with passive components. Note that the word jumper is used in a broad sense to identify a removable electrical conductor which includes solid jumper bridges, wires, thin coaxial cables or conductors with passive electrical components in series therewith. These figures show generalized layouts and do not represent the specific physical layout on the interface board. The circles represent jumper terminals or pads on an interface board. A solid pad represents a connection between a jumper and a jumper terminal. A solid line between two jumper terminals represents a direct connection between those two jumper terminals.

Figure 7:
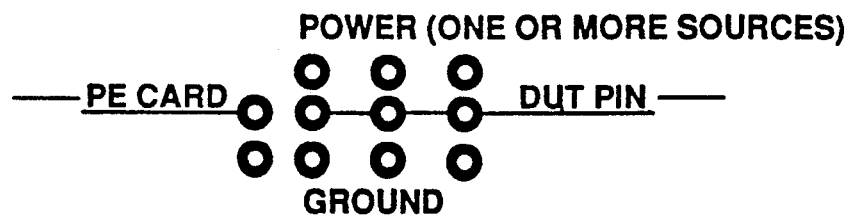
FIG. 7 shows a jumper terminal layout pattern for an uncommitted DUT pin.

FIG. 7 illustrates the general layout of a group of jumper terminals for a DUT pin which is uncommitted. Various power sources are connected to the top row of pads. Grounds are connected to the bottom row. The middle row of terminals are for signals from the PE circuits or are used for connecting a DUT pin or terminal.

Figure 8A:
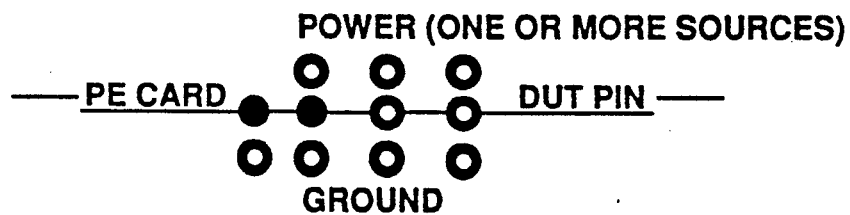
FIG. 8A shows a jumper terminal layout pattern with a jumper connection between an I/O signal and a DUT pin.

FIG. 8A illustrates a jumper connected between the jumper terminals on each side of a gap in a signal trace to provide a signal path between a pin electronics (PE) circuit and a DUT pin.

Figure 8B:
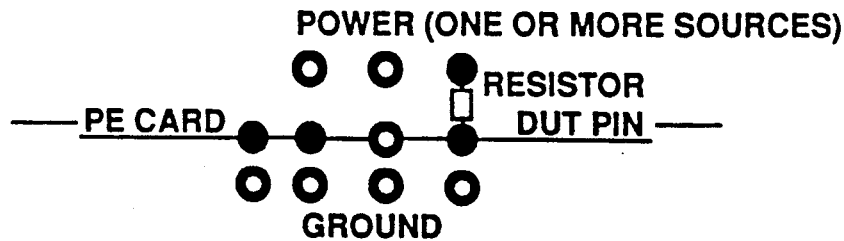
FIG. 8B shows a jumper terminal layout pattern with a jumper connecting an I/O signal to a DUT pin and with a pullup resistor connected between the DUT pin and a Power terminal.
Figure 8C:
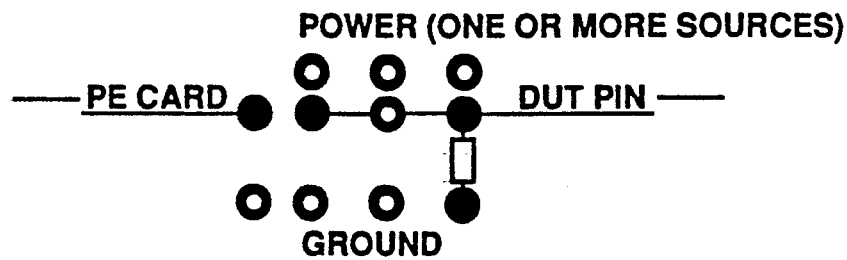
FIG. 8C shows a jumper terminal layout pattern with a jumper connecting an I/O signal to a DUT pin and with a pulldown resistor connected between the DUT pin and a ground terminal.

FIGS. 8B and 8C illustrate jumpers having series resistors, respectively, connected to a power source or to a ground to serve as either a pull-up resistor or as a pull-down resistor on a DUT pin.

Figure 8D:
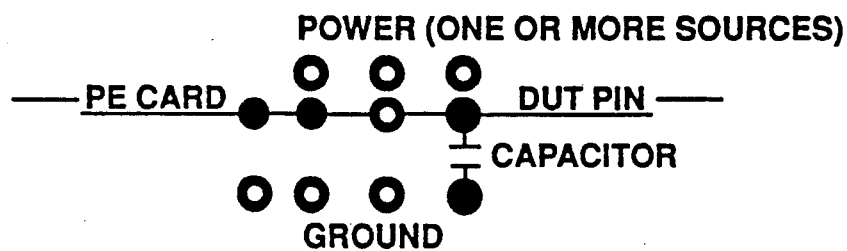
FIG. 8D shows a jumper terminal layout pattern with a jumper connecting an I/O signal to a DUT pin and with a capacitive load connected to ground.

FIG. 8D illustrates a jumper having a series capacitor connected between a signal line and ground for applying additional capacitive loading to a DUT signal pin.

Figure 9:
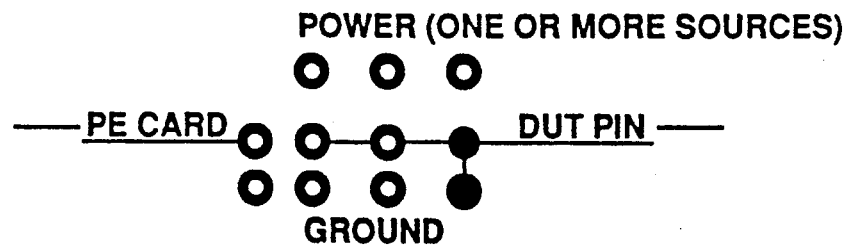
FIG. 9 shows a jumper terminal layout pattern with a jumper connecting a DUT pin to ground.

FIG. 9 illustrates a jumper directly connecting a DUT pin to a ground plane.

Figure 10A:
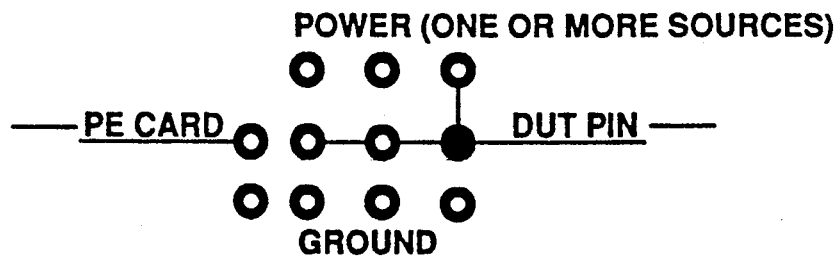
FIG. 10A shows a jumper terminal layout pattern with a jumper connecting a DUT pin to a power supply.

FIG. 10A illustrates a jumper directly connected between a DUT pin and a jumper terminal connected to a power plane.

Figure 10B:
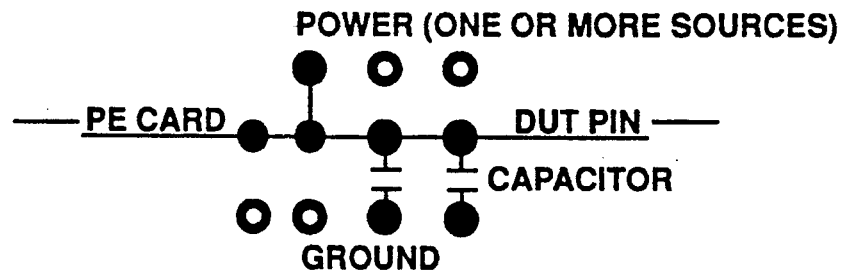
FIG. 10B shows a jumper terminal layout pattern with a jumper connecting a DUT pin to a power supply and with decoupling capacitors connected to ground.

FIG. 10B illustrates a jumper directly connecting a DUT pin to a power plane. Decoupling of stray signals to ground from the DUT pin is provided by use of two jumpers incorporating capacitors for bypassing low and high frequencies.

Figure 11:
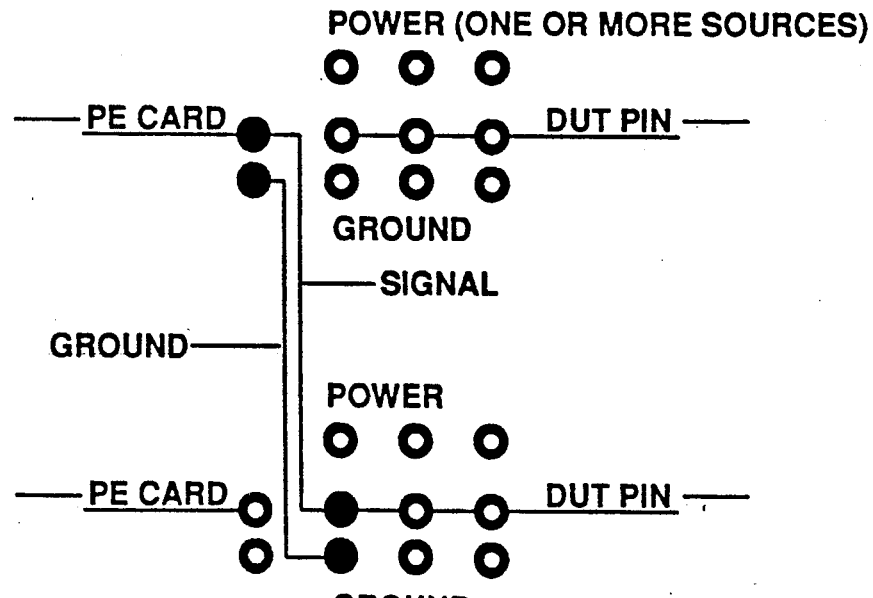
FIG. 11 shows a jumper terminal layout pattern with a coaxial cable connected for reassignment of a test channel from one DUT pin to another DUT pin.

FIG. 11 illustrates use of a coaxial-cable jumper to reassign a PE test channel to a different DUT pin while maintaining a controlled impedance for a test signal. The shield of the coaxial cable is connected to ground terminals. The coaxial cable conductor connects the PE circuit of one channel to a DUT pin ordinarily associated with another PE channel.

A number of improvements and advantages are obtained from the present invention described hereinabove. The cost and reliability problems associated with using electromechanical connectors, such as relays and toggle switches, are eliminated. For example, for testing integrated circuits with 256 pins, the invention eliminates 256 relays and 256 toggle switches.

Elimination of relays and switches allows the physical size and complexity of the programming portion of an interface board to be reduced considerably.

Saving in time and effort may be achieved by the simplicity of programming a DUT pin. Checking of the correctness of the programming for a DUT pin is easily implemented by a software routine in the ATE program.

By elimination of relays and switches on the periphery of an interface board, better signal integrity is obtained because fewer mechanical stubs are present on the signal line and a signal line is broken for only a short distance. The invention minimizes transmission line reflection effects and maintains a controlled impedance characteristic for the signal lines.

The connection area used by the invention is much smaller in comparison to the area used by relays and switches. This permits device power and ground connections to be physically made much closer to the DUT pin. Consequently, conductors have less inductance and interference from switching noise on the device power supplies and grounds is reduced. The invention also permits decoupling capacitors to be placed much closer to DUT pins and consequently provide more effective decoupling.

The invention permits loading of signal and power lines with passive components such as pull-up or pull-down resistors and with loading capacitors. The passive components are incorporated into the jumpers.

Finally, reassignment of test channels to different DUT pins is easily accomplished by use of, for example, coaxial cable jumpers. Systems using relays and switches cannot easily reassign channels.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A jumper programmable interface board providing manually programmable electrical interconnections between automated test equipment and the terminals of an integrated circuit device under test (DUT), said jumper programmable interface board comprising:

an interface board having a plurality of conductive paths formed thereupon, wherein the integrated circuit DUT is mounted on a major surface of said interface board, wherein jumper terminals are located in close proximity to said DUT, wherein the jumper terminals which are associated with an array for a particular terminal of a DUT are grouped together, wherein adjacent terminals of an array of said jumper terminals are spaced apart by a predetermined distance, wherein one or more of said conductive paths is a signal path adapted to be coupled to said automated test equipment, wherein one or more of said conductive paths is coupled to a power supply source for said DUT, and wherein one or more of said conductive paths is coupled to a circuit ground potential;

means for selectably connecting one or more of the various ones of said conductive paths of said interface board simultaneously to each of the various terminals of said DUT, said connecting means including:

a plurality of arrays of said jumper terminals, each of said arrays being located on said interface circuit board and associated with a respective DUT terminal, wherein certain ones of said jumper terminals of each array are connected to certain ones of said conductive paths and wherein other ones of said jumper terminals of each array are connected to the terminals of said DUT; and means for manually programming interconnections between said conductive paths and said terminals of said DUT, said manual programming means including a plurality of groups of removable pin-and-socket jumper means, each group of jumper means being associated with a respective DUT terminal for simultaneously coupling each of the jumper terminals, which are connected to the respective DUT terminal, to jumper terminal which are within the same array of jumper terminals associated with a respective DUT terminal and which are connected to said conductive paths.

2. The jumper programmable interface board of claim 1 wherein the jumper terminals includes jumper pins fixed to and extending from said interface circuit board.

3. The jumper programmable interface board of claim 2 wherein said jumper means includes socket means for engaging said jumper pins.

4. The jumper programmable interface board of claim 1 wherein said jumper means includes a passive electrical component.

5. The jumper programmable interface board of claim 4 wherein said passive electrical component includes a capacitor.

6. The jumper programmable interface board of claim 4 wherein said passive electrical component includes a resistor.

7. The jumper programmable interface board of claim 4 wherein said passive component includes a signal transmission line.

8. The jumper programmable interface board of claim 1 wherein said interface board is a multi-layer printed circuit board.

9. The jumper programmable interface board of claim 1 wherein the DUT is mounted on the interface board with mounting means including releasable holder means for mounting said DUT.

* * * * *